United States Patent
Berry et al.

(10) Patent No.: US 7,469,399 B2
(45) Date of Patent: Dec. 23, 2008

(54) SEMI-FLATTENED PIN OPTIMIZATION PROCESS FOR HIERARCHICAL PHYSICAL DESIGNS

(75) Inventors: Christopher J. Berry, Hudson, NY (US); Christopher M. Carney, Red Hook, NY (US); David L. Rude, Poughkeepsie, NY (US); Eddy St. Juste, Bridgeport, CT (US)

(73) Assignee: International Business Machines Corporation, Armonk, NY (US)

( * ) Notice: Subject to any disclaimer, the term of this patent is extended or adjusted under 35 U.S.C. 154(b) by 173 days.

(21) Appl. No.: 11/531,398

(22) Filed: Sep. 13, 2006

(65) Prior Publication Data
US 2008/0066039 A1   Mar. 13, 2008

(51) Int. Cl.
*G06F 17/50* (2006.01)
*G06F 9/45* (2006.01)

(52) U.S. Cl. .............. 716/10; 716/1; 716/5; 716/6; 716/9; 716/11; 716/18; 703/13; 703/14

(58) Field of Classification Search ............... 716/8–14, 716/1, 5, 6, 18; 703/13, 14
See application file for complete search history.

(56) References Cited

U.S. PATENT DOCUMENTS

| | | | |
|---|---|---|---|
| 6,345,381 B1 | 2/2002 | Leight et al. | |
| 6,357,035 B1* | 3/2002 | Gowni et al. | 716/11 |
| 6,415,428 B1* | 7/2002 | Camporese et al. | 716/12 |
| 6,662,349 B2* | 12/2003 | Morgan et al. | 716/10 |
| 6,883,156 B1* | 4/2005 | Khainson et al. | 716/11 |
| 2002/0261048 | 12/2004 | Bucki et al. | |

FOREIGN PATENT DOCUMENTS

JP   2001-53154   2/2001

* cited by examiner

*Primary Examiner*—Jack Chiang
*Assistant Examiner*—Nghia M Doan
(74) *Attorney, Agent, or Firm*—Lynn L. Augspurger; L. J. Marhoefer

(57) ABSTRACT

In a hierarchical semiconductor digital unit comprised of a plurality of macro functional logic blocks, each of said macro functional logic blocks comprised of a plurality of leaf cells, each of said leaf cells accessed via an input terminal and an output terminal, the improvement wherein locating each input terminal provides access to a single leaf cell at a legal location proximate the leaf cell to which the input terminal provides access.

1 Claim, 3 Drawing Sheets

SEMI-FLATTENED PIN OPTIMIZATION PROCESS FOR HIERARCHICAL PHYSICAL DESIGNS

BACKGROUND OF THE INVENTION

1. Field of the Invention

This invention relates to an improved hierarchical semiconductor digital chip design and method for implementing the design, and more particularly to a chip design that optimizes pin locations for internal timing of a functional block.

2. Description of Background

Designers of the physical embodiment a semiconductor chip to carry out a logic function traditionally divide the overall chip structure into functional blocks that are small components of the overall function. These functional blocks are treated as abstractions at the top level. The first level of abstracted blocks are further divided into yet smaller physical blocks that are themselves abstracted and this process of dividing into blocks and treating them as abstracts continues until at the lowest level the content of the physical block is a reasonable small enough portion of the of the logic so that people and or programs can work with it. FIG. 1 illustrates this hierarchical approach to the design of complex digital electronic components such as computer components. A functional block referred to here as a macro is comprised of standard semiconductor circuit elements lc commonly referred to as leaf cells. These macros are combined and interconnected (not shown) to form the overall chip structure unit.

The logical functions executed by the leaf cells that make up an abstract determine the need for terminals called pins associated with the abstract along with need for points that can be connected together to form a specific network. A typical prior art design is illustrated in FIG. 2. The enclosing rectangular frame is meant to represent the abstract. The abstract can be thought of as the bounding box of the logical block. Input pins and output pins are normally placed on the edge of the abstract as shown in the FIG. 2. Leaf cells A, B, C, and D formed in the semiconductor are connected to corresponding input pins A, C, and D (input pin A serves leaf cells A and B in this illustration) and output pins A, B, C, and D. These connection points to the leaf cells called pins are usually placed around the peripheral border of an abstract, usually on the side or corner or combination thereof that results in the shortest distance to the next pin in the same network in a manner similar to how one would construct a logical flow diagram. However, this prior art pin placement design can create a problem. The wiring paths among pins and the placement of leaf cells within an abstracted functional block may be critical to an efficient implementation of its logical function and if not considered can be critical to the success of the network. One of the problems encountered with the prior art pin placement design are the need for additional re-powering circuit and wire delay—the location of the pins has an effect on the circuit delays within the abstracted functional block. In FIG. 2 the small boxes labeled i represent re-powering circuits required because of the distance between the leaf cell lc and the input/output pins located on the border of the macro. For example, the re-power circuitry is comprised of a pair of serial connected inventors needed to drive the distance between the leaf cell driver and an output pin. Another problem is perimeter crowding—the perimeter of the physical abstracted functional block can limit the number of pins that can be placed.

For example, pin placement affects circuit delay when the input pin is on one side of an abstracted functional block and the output pin is on the opposite side. The physical distance between pins may be so great that additional buffering may be required to transmit the signal or form the logic, thereby introducing additional circuit delay. The prior art techniques do not consider information about the logic within the abstracted entity when placing pins, but merely the connection between the pin and the next level of the hierarchy. The additional delay within an abstracted functional block is a result not only of the addition of extra circuits to implement the this functional block, but also because metal that comprises the wiring between the pins and the circuits of the abstracted functional block often has a higher delay characteristic than a similar connection at the next level in the hierarchy. Hierarchical designs often allocate metal layers to each level of abstraction in the hierarchy such that the lowest level of hierarchy gets the metal layers with a larger resistance per unit length, resulting in a larger delay per unit length. Therefore, as a general rule, any distance that can be traversed across an abstracted functional block on a higher level of metal (usually available at the next level of the hierarchy) rather than at the lower level of the hierarchy will take less time.

For any given pin geometry a fixed number of pins will fit per unit length of the perimeter of the abstracted functional block. In some cases the abstract's perimeter is not long enough to contain the number of pins required by that abstract. In the prior art designs, the abstract's area is increased until its perimeter is sufficiently long to accommodate the number of pins required. But this increases the distance between pins and consequentially the delay among paths. In addition, there is a non-linear increase in abstract area with increase in perimeter length, taking up silicon space merely for the sake of pin placement.

SUMMARY OF THE INVENTION

Briefly, this invention contemplates the provision of a hierarchical chip design in which pins are located at or near the physical leaf cell to which the pin connects. The invention optimizes the placement of the physical leaf circuits and uses this to determine where a pin is to be placed. This chip design results in circuits that are optimally placed based on only timing and network considerations (physical and logical), without pin placement as a factor. Pins are then placed optimally based on the circuits that they connect to, resulting in better wiring with less delay to those pins and to subsequent circuits. This design also results in an environment where it is desired to reuse the design, since it is not clear in advance to which side of an abstracted functional block access should be provided.

The invention is a process of building a physical circuit implementation of logic within an abstracted functional block, which will be referred to as a macro. The process has three fundamental steps. The initial step is to synthesize the macro without considering the locations of its input and output pins. This allows the synthesizer and placer computer aided design software to agglomerate a physical design of the circuit that best implements the specified logic function. That is to say, the location of any leaf cell is not influenced by the position of pin to which it must connect. This can be accomplished by setting the input/output (i/o) net weights in the computer aided design program to zero. The next step is to identify those leaf cells that connect to a pin and then place that pin over the leaf cell or if the pin connects to more than one leaf cell, at the centroid of the leaf cell to which it connects. Finally, an unnecessary circuitry between the pin and the logic circuitry that may have been included because of a pin's initial remote location from its logic circuitry is identified and eliminated. This can be accomplished by re-synthesizing the design with the pin locations established in accordance with the teachings of the invention.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 3:
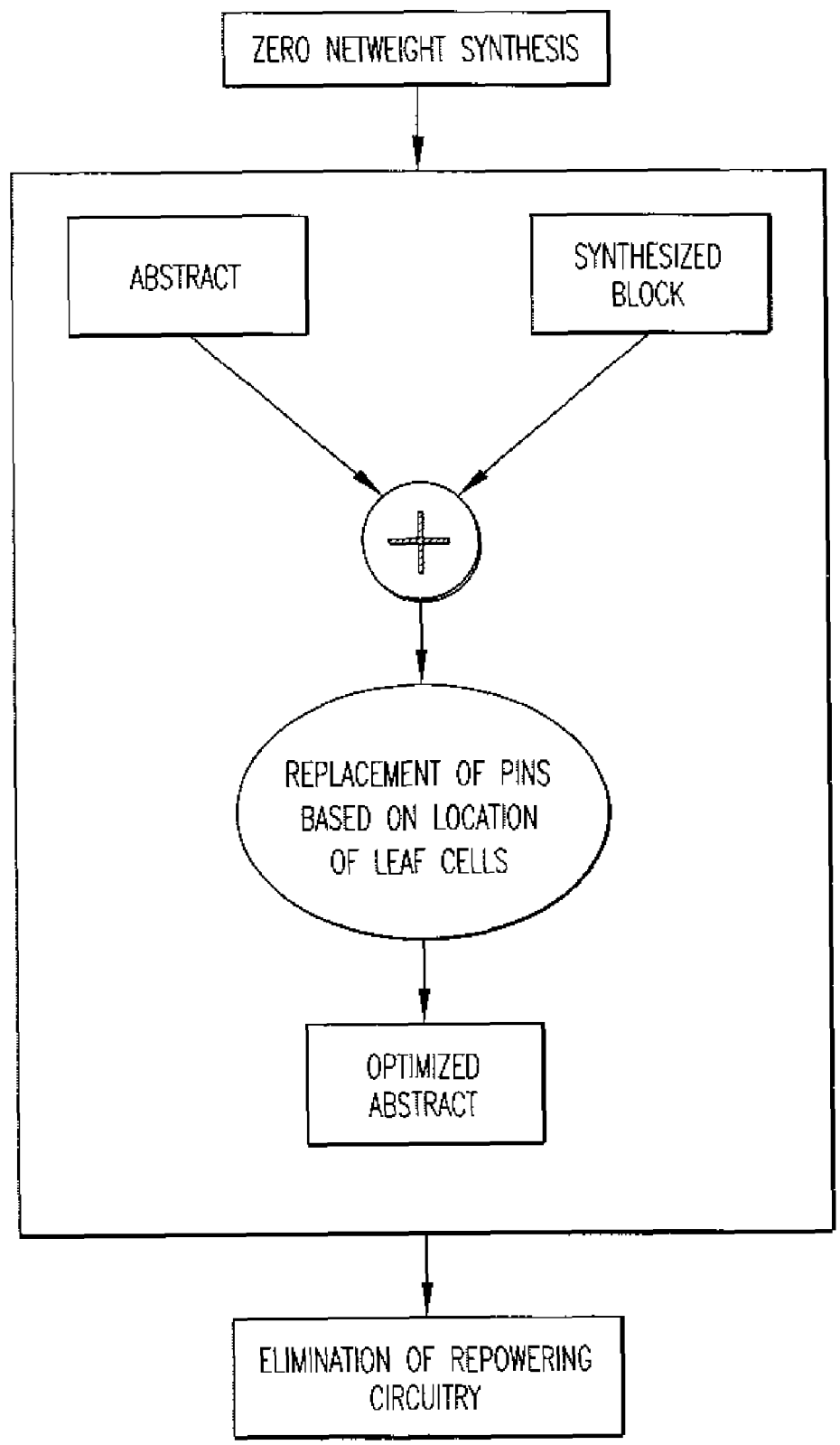
FIG. 3 is a flow diagram of the steps in the design of functional block in accordance with the teachings of this invention.

Referring now to FIG. 3 of the drawings, the initial step in the design of a macro in accordance with the teachings of this invention is to set to zero the input/output pin net weights in a suitable prior art computer automated design program used to design functional block macros. The result of this initial step is a synthesized block of leaf cells lc to implement the macro function. As explained above, in prior art synthesized designs, pin placement is determined prior to synthesizing the logical block via the abstract. The synthesis tool uses the abstract fed to it to create a synthesized block that attempts to meet logical and timing constraints based on the pin placement. In the process of this invention, the synthesized block is a result of a zero net weight synthesis resulting in the leaf cells being placed independently of pin locations in the original abstract.

In the next step, the synthesized block is compared with the functional abstract of the macro in order to create a pin grid based on the possible legal pin locations required by the abstract. Next, each required input/output pin is located at a legal pin location that is nearest to the receiving/driving leaf cell that it is intended to serve. It will be appreciated that the original abstract contains more information than just the original pin locations. The power grid locations and wiring contract locations are also contained in the abstract. When determining where to place the pins with respect to the leaf cell location, these aspects must be respected. Legal pin locations are locations exclusive of power grid and wire contact locations. For inputs serving multiple leaf cells, the legal grid point closest to the geometric center of the leaf cells is selected. The final step is the elimination of un-needed re-powering circuitry between the pin and the leaf circuit because of the pin's initial remote position from the leaf circuit. This can be accomplished by re-synthesizing the macro with the pins in the locations developed in the previous step, or by other suitable software programs.

Figure 1:
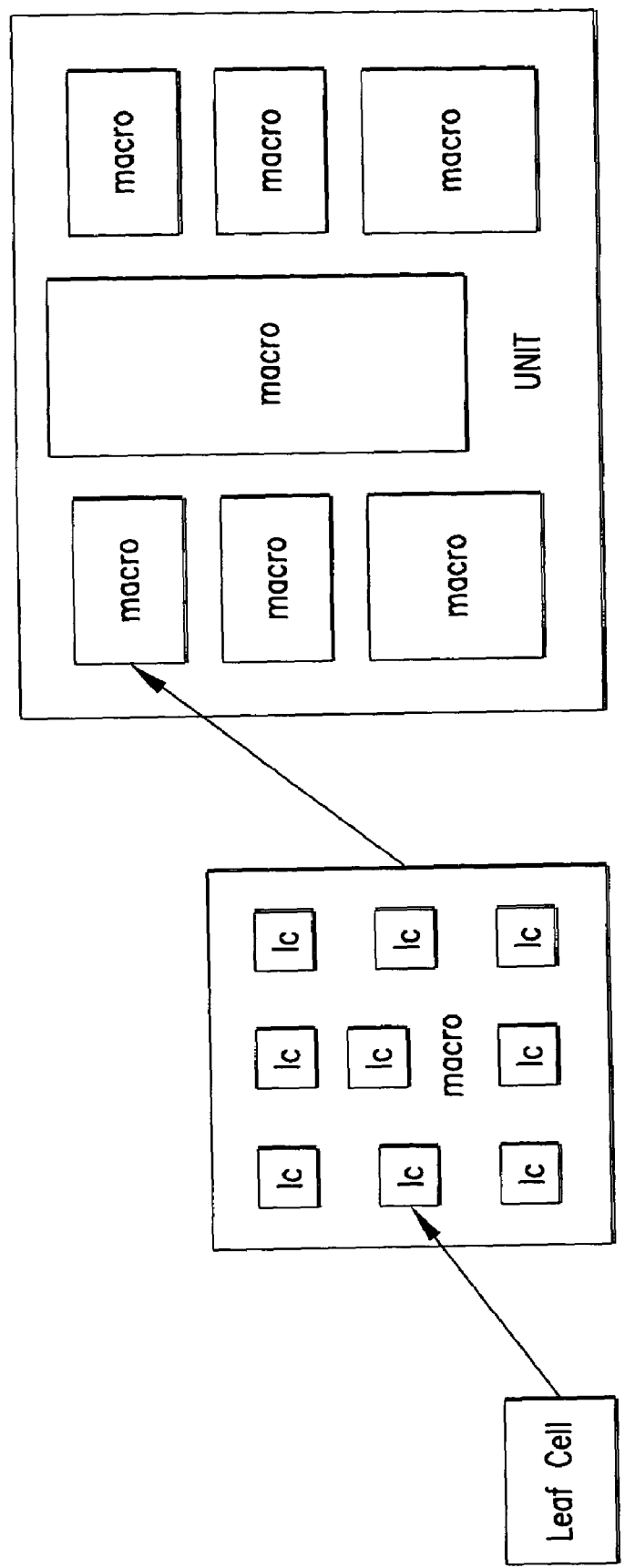
FIG. 1 is a schematic block diagram illustrating the hierarchical design of a typical electronic device such as a computer component.
Figure 2:
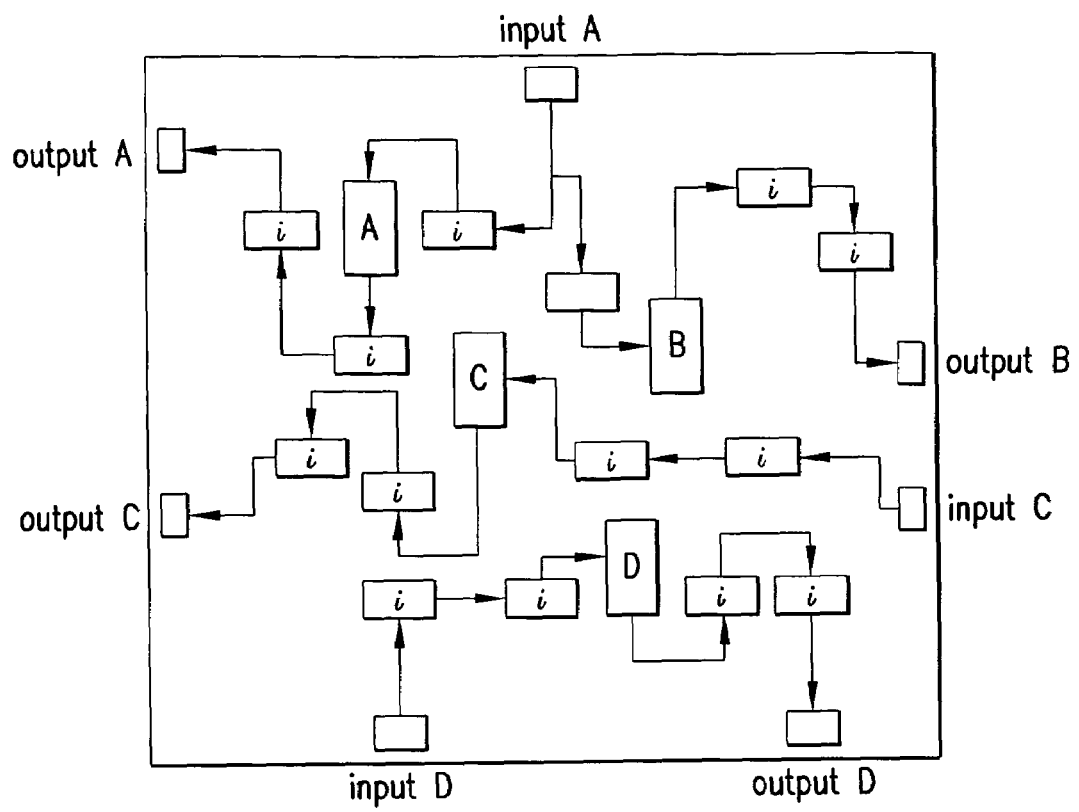
FIG. 2 is a schematic block diagram illustrating the prior art design of a macro in which the input/output pins a located on the periphery of the macro.
Figure 4:
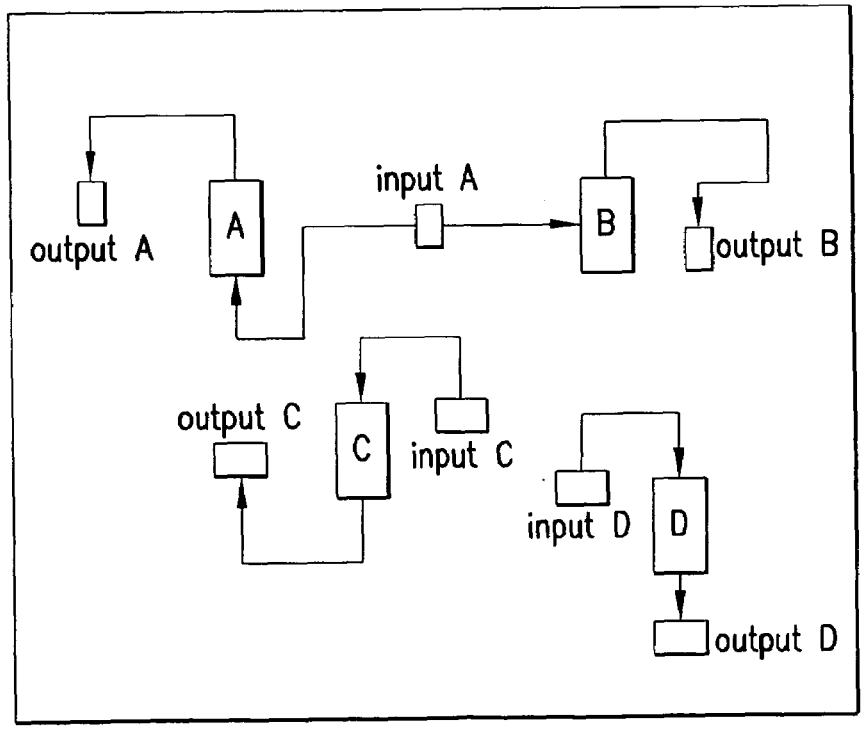
FIG. 4 is a schematic block diagram of the macro shown in FIG. 2 but with input/output pin locations in accordance with the teachings of this invention.

As will be apparent from a comparison of FIGS. 2 and 4, the result is a macro with pin locations that are optimally located with respect to minimizing internal path length and internal signal delay.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. In a hierarchal semiconductor digital unit comprised of a plurality of macro functional logic blocks each comprised of a plurality of leaf cells located within a peripheral border of each of said plurality of macro functional logic blocks, each of said leaf cells within a macro accessed by signals from signals outside the macro via an input pin and an output pin, the improvement comprising:

synthesizing each macro block without regard to the location of said input pin and said output pin for each of said leaf cells;

determining a grid of legal pin locations for each macro block synthesized in said synthesizing step;

locating each said input pin providing access to a leaf cell at a legal location nearest to said leaf cell to which said input pin provides access;

locating each said output pin providing access to a leaf cell at a legal location nearest to said leaf cell to which said output pin provides access;

locating each said input pin providing access to a plurality of leaf cells at a legal location inboard of said peripheral border closest to the geometric center of said plurality of said plurality of leaf cells;

locating each said output pin providing access to a plurality of leaf cells at a legal location inboard of said peripheral border closest to the geometric center of said plurality of said plurality of leaf cells; and re-synthesizing each macro with input and output pins located in accordance with the previous claim steps in order to eliminate unneeded re-powering circuitry between a pin and a leaf.

* * * * *